United States Patent
Sabapathi et al.

(10) Patent No.: US 12,007,423 B2
(45) Date of Patent: Jun. 11, 2024

(54) PORTABLE NODAL IMPEDANCE ANALYSER

(71) Applicant: QMAX TEST EQUIPMENTS PVT. LTD., Tamil Nadu (IN)

(72) Inventors: S. R. Sabapathi, Tamil Nadu (IN); M. Pazhanivel, Tamil Nadu (IN)

(73) Assignee: QMAX TEST EQUIPMENTS PVT, LTD, Chennai (IN)

( * ) Notice: Subject to any disclaimer, the term of this patent is extended or adjusted under 35 U.S.C. 154(b) by 0 days.

(21) Appl. No.: 17/891,938

(22) Filed: Aug. 19, 2022

(65) Prior Publication Data
US 2023/0080282 A1 Mar. 16, 2023

(30) Foreign Application Priority Data
Sep. 2, 2021 (IN) .............................. 202141039773

(51) Int. Cl.
*G01R 27/16* (2006.01)
*G01R 31/28* (2006.01)

(52) U.S. Cl.
CPC ......... *G01R 27/16* (2013.01); *G01R 31/2801* (2013.01)

(58) Field of Classification Search
CPC .... G01R 27/00; G01R 27/16; G01R 31/2801; G01R 31/2812
USPC ....................................... 324/525, 600, 650
See application file for complete search history.

(56) References Cited

U.S. PATENT DOCUMENTS

| | | | | | |
|---|---|---|---|---|---|
| 3,283,242 | A | * | 11/1966 | Oliver | G01R 27/02 324/715 |
| 4,012,625 | A | * | 3/1977 | Bowen | G01R 31/2806 714/734 |
| 5,414,715 | A | * | 5/1995 | Hamblin | G01R 31/2812 714/724 |
| 7,057,395 | B1 | * | 6/2006 | Williamson | G01R 31/2812 324/519 |
| 7,609,081 | B2 | * | 10/2009 | Wong | G01R 31/2834 324/73.1 |

(Continued)

FOREIGN PATENT DOCUMENTS

| | | | | |
|---|---|---|---|---|
| CN | 107121609 A | * | 9/2017 | ............. G01R 27/16 |
| CN | 108693459 A | * | 10/2018 | |
| WO | WO-2021058678 A1 | * | 4/2021 | ......... G01R 19/2513 |

OTHER PUBLICATIONS

Qmax, QT-Hi1 User Manual. Copyright—Qmax Test Equipments Pvt Ltd., Feb. 2018 (Year: 2018).*

*Primary Examiner* — Christopher P McAndrew
(74) *Attorney, Agent, or Firm* — GableGotwals

(57) ABSTRACT

A portable nodal impedance analyser. The impedance analyser (100) is configured with an auto best curve-fit application which automatically selects the values for Voltage, Source Impedance and Frequency of the stimulus waveform (best fit values) to generate equivalent circuit and its appropriate V-I traces. The auto best curve-fit application automatically selects one or more input Sinusoidal Patterns (Waveforms) in such a way that the V-I Characteristics of the components present in a Node (the two points across which the input Pattern is driven, and response is received), are best revealed by automatically adjusting the Drive Voltage (0.2V, 4V, 8V and 13V), Source Impedance (10Ω, 50Ω, 100Ω, 500Ω, 1KΩ, 5KΩ, 10KΩ, 50KΩ, 100KΩ) and Frequency (from 1 Hz to 50 KHz) of the input Patterns.

10 Claims, 2 Drawing Sheets

(56) References Cited

U.S. PATENT DOCUMENTS

| | | | | |
|---|---|---|---|---|
| 7,755,371 | B2* | 7/2010 | Wells | G01R 27/16 |
| | | | | 324/522 |
| 8,810,257 | B2* | 8/2014 | Simpson | G01R 31/2837 |
| | | | | 324/637 |
| 10,161,991 | B2* | 12/2018 | Howard | G01R 31/2803 |
| 2006/0022678 | A1* | 2/2006 | Hegazy | G01R 31/2853 |
| | | | | 257/E23.142 |
| 2008/0204054 | A1* | 8/2008 | Wells | G01R 27/16 |
| | | | | 324/713 |
| 2009/0128173 | A1* | 5/2009 | Wong | G01R 31/2834 |
| | | | | 324/750.3 |
| 2010/0026315 | A1* | 2/2010 | Simpson | G01R 31/2822 |
| | | | | 324/600 |
| 2016/0077030 | A1* | 3/2016 | Stanley | G01N 27/228 |
| | | | | 324/650 |
| 2018/0059169 | A1* | 3/2018 | Howard | G01R 31/2815 |
| 2021/0181250 | A1* | 6/2021 | Fang | G01R 27/28 |
| 2023/0080282 | A1* | 3/2023 | Sabapathi | G01R 27/16 |
| | | | | 324/650 |

* cited by examiner

PORTABLE NODAL IMPEDANCE ANALYSER

CROSS REFERENCE TO RELATED APPLICATION

This application claims priority under 35 U.S.C. § 119 to Indian Application No. 202141039773, filed Sep. 2, 2021, the disclosure of which is incorporated herein by reference in its entirety.

TECHNICAL FIELD

Embodiments are generally related to the field of measurement techniques. Embodiments are also related to characteristic impedance testing systems and methods. Embodiments are further related to devices and methods for analysis of impedance and determination of properties of the electric circuits and PCBs. Embodiments are particularly related to a portable nodal impedance analyser for automatically selecting the values for Voltage, Source Impedance and Frequency of the stimulus waveform to generate equivalent circuit and its appropriate V-I traces.

BACKGROUND OF THE INVENTION

In the field of automated printed circuit board (PCB) testing, it is challenging to perform rigorous and complete testing of a printed circuit board simply and inexpensively, including all possible fault modes. Faults in a printed circuit board containing digital circuitry are generally either stuck-at-one or stuck-at-zero conditions.

The conventional printed circuit board test facilities comprise "bed of nails" test fixtures that force a matrix of spring-loaded test pins against the printed circuit board under test to access the conductive pads formed thereon. The printed circuit board test facility then applies a predetermined vector of drive signals to the circuitry on the printed circuit board under test and measures the response of the circuit to these test vectors. Such conventional prior art testing facilities are cumbersome, time consuming and inefficient.

Trouble shooting of electronic equipment and more particularly relates to the fault isolation on a printed circuit board where a large number of components are connected in a wired-OR configuration is a challenging affair in the state-of-the-art. More specifically, with printed circuit boards having a high density of expensive components, the problem of identifying a faulty component which renders the entire circuit board unusable is important from an economic standpoint.

If the situation arises where the output of two or more components such as integrated circuits (IC's) are tied to one bus in a wired-OR configuration and that bus is held low because of a defective IC, the objective is to locate the defective IC so that it can be replaced without removal of other components from the circuit board.

Characteristic impedance testing of signal path routings of a PCB is an important phase in the manufacturing/testing process and is closely interrelated to product quality. For further improvements to the impedance characterization of signal routings, a prompt and accurate test of characteristic impedances of the signal path routings on the PCB is desirable.

Based on the foregoing a need therefore exists for an improved portable nodal impedance analyser for automatically selecting the values for Voltage, Source Impedance and Frequency of the stimulus waveform to generate equivalent circuit and its appropriate V-I traces, as discussed in greater detail herein.

SUMMARY OF THE INVENTION

The following summary is provided to facilitate a clear understanding of the new features in the disclosed embodiment, and it is not intended to be a full, detailed description. A detailed description of all the aspects of the disclosed invention can be understood by reviewing the full specification, the drawing and the claims and the abstract, as a whole.

One objective of the present invention relates to provide an improved device for analysing the impedance in the PCBs and electronic devices.

Another objective of the present invention is to provide an improved device and method for analysis of impedance and determination of properties of the electric circuits and PCBs.

Further objective of the present invention is to provide portable nodal impedance analyser for automatically selecting the values for Voltage, Source Impedance and Frequency of the stimulus waveform to generate equivalent circuit and its appropriate V-I traces.

The aforementioned aspects along with the objectives and the advantages can be achieved as described herein. A portable nodal impedance analyser (100) for automatically selecting the values for Voltage, Source Impedance and Frequency of the stimulus waveform to generate equivalent circuit and its appropriate V-I traces, is disclosed herein. The impedance analyser (100) is configured with an auto best curve-fit application (110) which automatically selects the values for Voltage, Source Impedance and Frequency of the stimulus waveform (best fit values) to generate equivalent circuit and its appropriate V-I traces. The auto best curve-fit application (110) automatically selects one or more input Sinusoidal Patterns (Waveforms) in such a way that the V-I Characteristics of the components present in a Node (the two points across which the input Pattern is driven, and response is received), are best revealed by automatically adjusting the Drive Voltage (0.2V, 4V, 8V and 13V), Source Impedance (10Ω, 50Ω, 100Ω, 500Ω, 1KΩ, 5KΩ, 10KΩ, 50KΩ, 100KΩ) and Frequency (from 1 Hz to 50 KHz) of the input Patterns.

The impedance analyser (100) configured with the auto best curve-fit application (110) effectively drives a sine wave of the selected frequency and amplitude with the source impedance into an electrical node and measures the resultant current and plots a Voltage vs Current (V-I) trace wherein the trace with the pins of a working device can be compared with that of a suspected device, to see any deviation in the V-I traces to conclude if there is any failure. Most failure in electronic or semiconductor devices happen on the periphery of the devices on I/O pins while the internal wafer is often quite intact which can be detected by V-I trace or nodal impedance check.

BRIEF DESCRIPTION OF DRAWINGS

The drawings shown here are for illustration purpose and the actual system will not be limited by the size, shape, and arrangement of components or number of components represented in the drawings.

DETAILED DESCRIPTION

Figure 1:
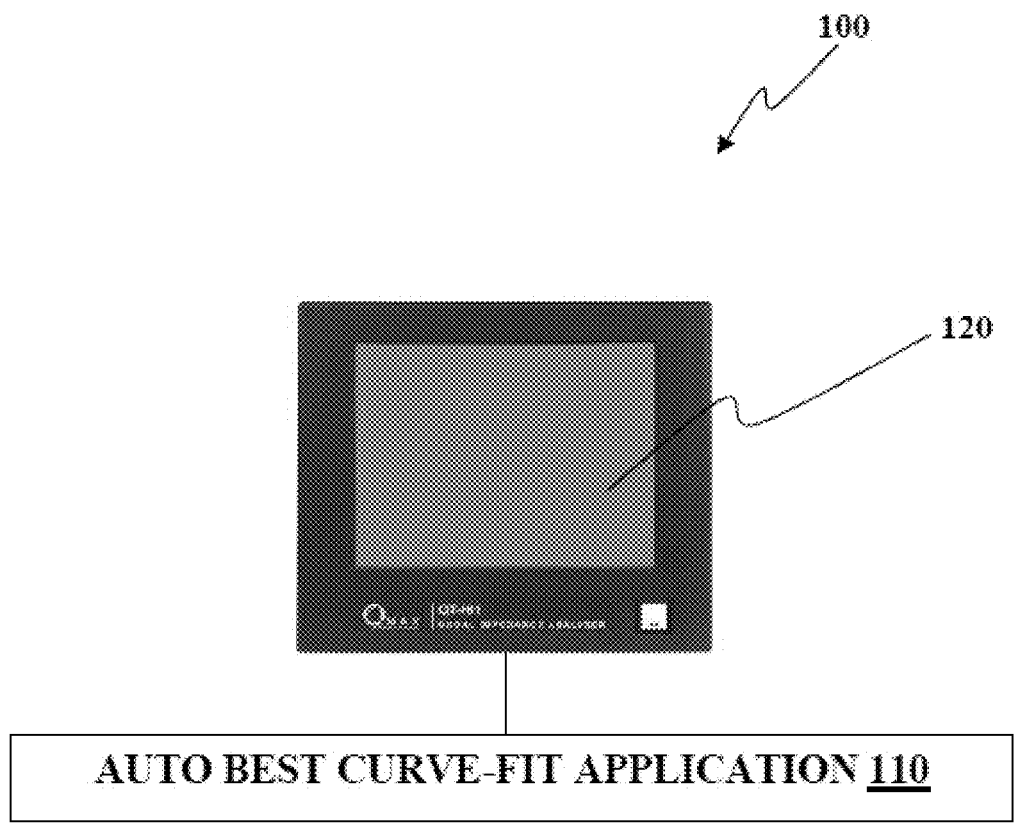
FIG. 1 illustrates a graphical representation of the impedance analyser (100) with auto best curve-fit application (110), in accordance with the disclosed embodiments.
Figure 2:
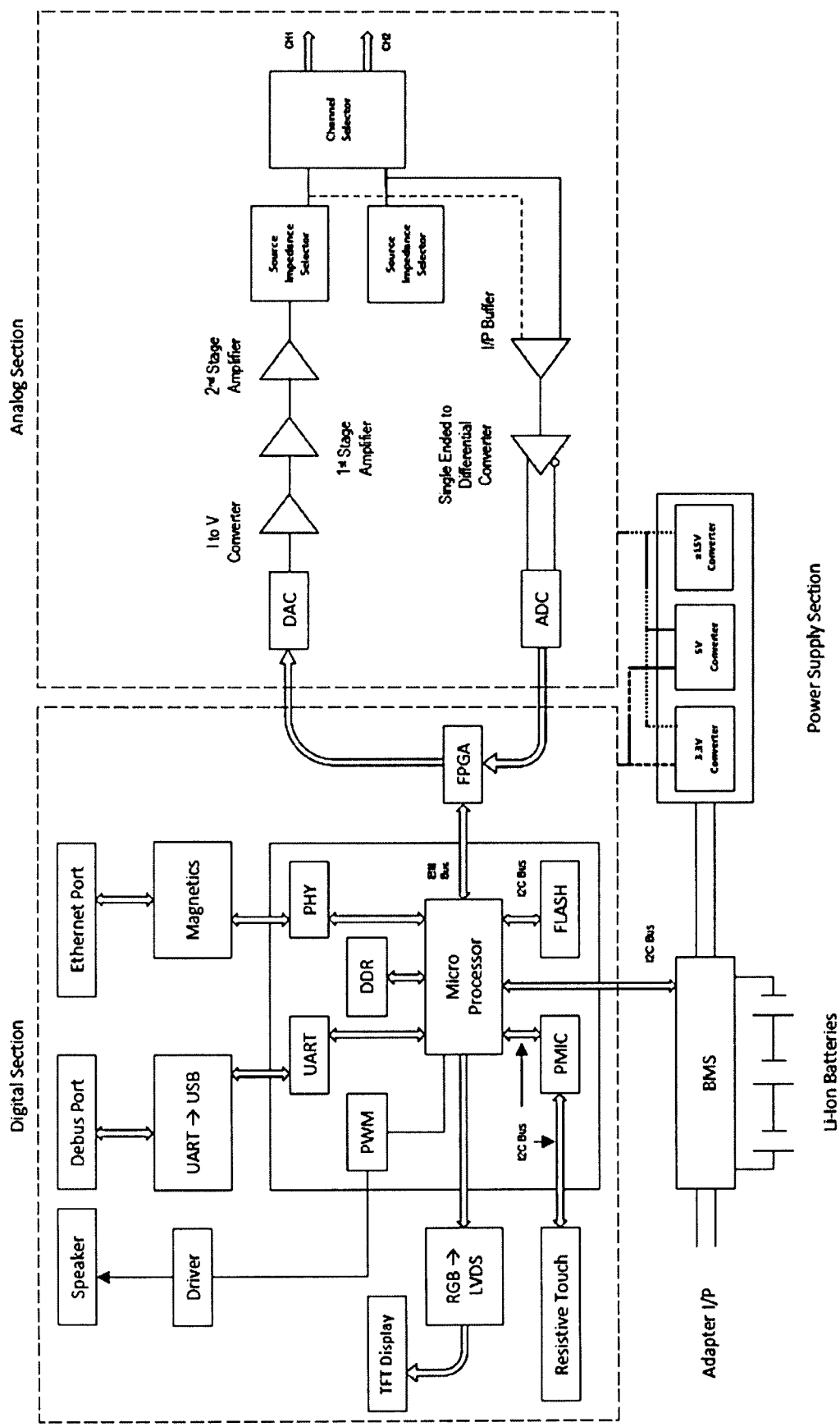
FIG. 2 illustrates a logical circuit diagram (200) of the impedance analyser (100), in accordance with the disclosed embodiments.

The principles of operation, design configurations and evaluation values in these non-limiting examples can be varied and are merely cited to illustrate at least one embodiment of the invention, without limiting the scope thereof.

The proposed invention teaches a portable nodal impedance analyser (100) for automatically selecting the values for Voltage, Source Impedance and Frequency of the stimulus waveform to generate equivalent circuit and its appropriate V-I traces. The impedance analyser (100) is configured with an auto best curve-fit application (110) which automatically selects the values for Voltage, Source Impedance and Frequency of the stimulus waveform (best fit values) to generate equivalent circuit and its appropriate V-I traces. The auto best curve-fit application (110) automatically selects one or more input Sinusoidal Patterns (Waveforms) in such a way that the V-I Characteristics of the components present in a Node (the two points across which the input Pattern is driven, and response is received), are best revealed by automatically adjusting the Drive Voltage (0.2V, 4V, 8V and 13V), Source Impedance (10Ω, 50Ω, 100Ω, 500Ω, 1KΩ, 5KΩ, 10KΩ, 50KΩ, 100KΩ) and Frequency (from 1 Hz to 50 KHz) of the input Patterns.

The impedance analyser (100) configured with the auto best curve-fit application (110) effectively drives a sine wave of the selected frequency and amplitude with the source impedance into an electrical node and measures the resultant current and plots a Voltage vs Current (V-I) trace wherein the trace with the pins of a working device can be compared with that of a suspected device, to see any deviation in the V-I traces to conclude if there is any failure. Most failure in electronic or semiconductor devices happen on the periphery of the devices on I/O pins while the internal wafer is often quite intact which can be detected by V-I trace or nodal impedance check.

The system (100) further comprises a graphical touch screen display (120) which makes the instrument exceptionally user-friendly with quick navigation. The user input/selection of various parameters can be through easy-to-use touch inputs and also using the smart embedded-key probe which helps in a quick change of stimulus parameters during probing. The system (100) thereby introduces a portable unit with an inbuilt rechargeable battery back-up for on-site troubleshooting and fault analysis.

The system (100) is capable of plotting both Voltage Vs Current (V-I) and Voltage vs Time (V-T) graphs. The system (100) works in Auto mode and Manual modes for selecting the test stimulus. In the manual mode, the test stimulus is user-selectable in terms of Voltage, Source Impedance, and Frequency.

In the auto mode, the system (100) automatically performs V-I characteristics and finds out the best combination of Voltage, Source Impedance and Frequency to reveal the possible components present at a particular circuit node using the Auto Best Curve-fit technique.

The system (100) also supports dual comparison in which the test stimulus is driven in both Probe 1 and Probe 2, and the V-I characteristics are plotted on the screen and compared simultaneously. This feature is extremely handy when the user wants to instantaneously compare the suspected PCB with respect to the Known Good PCB.

An audio buzzer indication is provided to the user whenever the difference between the already stored trace and the current trace exceeds the tolerance limit set by the user.

The system also comprises an inbuilt Self-test and Auto-calibration feature along with remote diagnostics and firmware update, thereby making it maintenance-friendly.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

We claim:

1. A portable nodal impedance analyser, comprising: an impedance analyser configured with an auto best curve-fit application which automatically selects at least one Voltage value, at least one Source Impedance value, and at least one Frequency value for an at least one sinusoidal stimulus waveform to generate an equivalent circuit and V-I traces in a way that models the V-I Characteristics of components present in a node.

2. The impedance analyser of claim 1, wherein the auto best curve-fit application effectively drives a sine wave of a selected frequency value and a selected amplitude value with a selected source impedance value into an electrical node of a test device, measures a resultant current, and plots a Voltage-vs-Current test trace, wherein the test trace can be compared to a control trace from a working device to identify failures across the electrical node.

3. The impedance analyser of claim 1, wherein the analyser further comprises a graphical touch screen display.

4. The impedance analyser of claim 1, wherein the analyser is configured to plot a Voltage-vs-Current graph and a Voltage-vs-Time graph.

5. The impedance analyser of claim 1, wherein the analyser has an auto mode and a Manual mode for selecting the at least one voltage value, the at least one Source Impedance Value, and the at least one Frequency value for the at least one sinusoidal stimulus waveform.

6. The impedance analyser of claim 1, wherein the analyser supports dual comparison in which the at least one sinusoidal stimulus waveform drives a first probe and a second probe, and wherein a voltage-vs-current graph for each of the first and second probes are plotted on a screen so that a user can compare the graphs simultaneously.

7. The impedance analyser of claim 1, wherein the analyser comprises an inbuilt self-test and an auto-calibration feature, the auto-calibration feature including remote diagnostics, and firmware updates.

8. The impedance analyser of claim 1, wherein the auto best curve-fit application adjusts the at least one Voltage value from the group consisting of 0.2V, 4V, 8V, and 13V.

9. The impedance analyser of claim 8, wherein the auto best curve-fit application adjusts the at least one Source Impedance value from the group consisting of 10 ohms, 50 ohms, 100 ohms, 500 ohms, 1 kiloohms, 5 kiloohms, 10 kiloohms, 50 kiloohms, and 100 kiloohms.

10. The impedance analyser of claim 9, wherein the auto best curve-fit application adjusts the at least one Frequency from a range of 1 Hz to 50 KHz.

* * * * *